US005770916A

United States Patent [19]

Ezaki et al.

[11] Patent Number: 5,770,916
[45] Date of Patent: Jun. 23, 1998

[54] LAMINATED PIEZOELECTRIC ELEMENT AND VIBRATION WAVE ACTUATOR

[75] Inventors: Toru Ezaki; Takahiro Yamakawa; Yutaka Maruyama, all of Tokyo; Nobuyuki Kojima, Kawasaki, all of Japan

[73] Assignees: Canon Kabushiki Kaisha; Nihon Cement Co., Ltd.

[21] Appl. No.: 592,859

[22] Filed: Jan. 24, 1996

[30] Foreign Application Priority Data

Jan. 31, 1995 [JP] Japan ................................... 7-034310

[51] Int. Cl.$^6$ ............................................. H01L 41/08
[52] U.S. Cl. ......................... 310/366; 310/323; 310/328
[58] Field of Search ................................... 310/323, 328, 310/366

[56] References Cited

U.S. PATENT DOCUMENTS

| | | | |
|---|---|---|---|
| 4,469,978 | 9/1984 | Hamada et al. | 310/366 |
| 4,759,107 | 7/1988 | Ogawa et al. | 310/328 |
| 4,870,313 | 9/1989 | Hirama et al. | 310/320 |
| 5,073,740 | 12/1991 | Jomura et al. | 310/358 |
| 5,271,133 | 12/1993 | Dam et al. | 310/328 |
| 5,356,500 | 10/1994 | Scheinbeim | 156/229 |

FOREIGN PATENT DOCUMENTS

| | | | |
|---|---|---|---|
| 0094078 | 11/1983 | European Pat. Off. | H01L 41/08 |
| 000584775 | 3/1994 | European Pat. Off. | 310/328 |
| 0584775 | 3/1994 | European Pat. Off. | H01L 41/09 |
| 93113470 | 3/1994 | European Pat. Off. | H01L 41/09 |
| 3832658 | 4/1989 | Germany | H02N 2/00 |
| 3-40767 | 2/1991 | Japan | H02N 2/00 |
| 3-117384 | 5/1991 | Japan | H02N 2/00 |
| 6-165540 | 6/1994 | Japan | H02N 2/00 |

OTHER PUBLICATIONS

European Patent Office Communication (May 15, 1996).

*Primary Examiner*—Thomas M. Dougherty
*Attorney, Agent, or Firm*—Fitzpatrick, Cella, Harper & Scinto

[57] ABSTRACT

A laminated piezoelectric element has a surface electrode formed on a surface of the element and having an area falling within the range from 0.002 mm$^2$ to 0.2 mm$^2$, and a first region excluding the surface electrode on the surface on which the surface electrode is formed, and having a level difference (surface roughness) which is less than or equal to 20 μm.

19 Claims, 7 Drawing Sheets

(STRUCTURAL VIEW)

SURFACE ELECTRODE 4

INNER ELECTRODE 2

3 INTER LAYER WIRING (STRUCTURAL VIEW)

LAMINATED CERAMIC PIEZOELECTRIC ELEMENT 1

SURFACE ELECTRODE 4

3 INTER LAYER WIRING (EXTERNAL VIEW)

SURFACE ELECTRODE 4

INNER ELECTRODE 2

3 INTER LAYER WIRING (STRUCTURAL VIEW)

LAMINATED CERAMIC PIEZOELECTRIC ELEMENT 1

SURFACE ELECTRODE 4

3 INTER LAYER WIRING (EXTERNAL VIEW)

(STRUCTURAL VIEW)

(EXTERNAL VIEW)

(STRUCTURAL VIEW)

(EXTERNAL VIEW)

LAMINATED PIEZOELECTRIC ELEMENT AND VIBRATION WAVE ACTUATOR

BACKGROUND OF THE INVENTION

1. Field of the Invention

The present invention relates to a laminated piezoelectric element or vibration actuator suitable for a vibration wave motor.

2. Related Background Art

Conventionally, for example as shown in Japanese Patent Application Laid-open Nos. 3-40767 and 3-117384, a Langevin type ultrasonic wave motor uses a vibration element having a structure constituted by laminating (stacking) a plurality of single-layered piezoelectric element plates, each having right and left or front and rear portions with opposite polarization directions in the direction of thickness, to sandwich an electrode plate between adjacent plates (see FIG. 8).

In recent years, a so-called laminated ceramic piezoelectric element obtained by integrating the above-mentioned structure is used to lower the driving voltage and reduce the size of the element.

Note that a laminated ceramic piezoelectric element 101 has the following structure. That is, an inner electrode 102, on which electrode patterns obtained by dividing a ring into four portions are formed, is present between each two adjacent ceramic layers, and every other one of the inner electrodes 102 in the laminating direction is connected by inter layer wiring lines 103, as shown in FIGS. 7A and 7B. On the surface of the element 101, surface electrodes 104 are connected to the inter layer wiring lines 103.

The element 101 is polarized so that its thickness increases in the first and second quadrants and decreases in the third and fourth quadrants upon application of, e.g., a positive voltage (of course, it exhibits opposite behaviors in the respective quadrants upon application of a negative voltage).

When the element 101 is driven, a resonant frequency signal having a given phase is input to the first and third quadrants (to be referred to as the "A phase" hereinafter), and a resonant frequency signal having a 90° phase difference from the former signal is input to the second and fourth quadrants (to be referred to as the "B phase" hereinafter), thus causing an oscillating vibration.

In the above-mentioned laminated ceramic piezoelectric element, the thickness of each layer constituting the element can be sufficiently smaller than that of the single-layered element plate, and a multi-layered structure can be realized. For this reason, the voltage required for driving the element can be greatly reduced, and a size reduction and a low-voltage driving operation of the element can be realized. As described above, the element has many good characteristics.

However, when the Langevin type ultrasonic wave motor or actuator is actually manufactured using the above-mentioned laminated ceramic piezoelectric element, the difference ($\Delta F$) between the resonant frequencies of the A and B phases of the vibration member is large, and the mechanical quality coefficient (Qm) is inferior to that of a motor using a single-layered piezoelectric element plates. As a result, a motor or actuator that can be practically used cannot be obtained.

Note that one of the present inventors also filed U.S. patent application Ser. No. 08/111,052 and European Patent Application No. 93113470.4.

SUMMARY OF THE INVENTION

One aspect of the invention is to provide a laminated piezoelectric element in which each of the upper and lower surfaces except for the surface electrodes of the element is formed to be a flat surface having a level difference which is less than or equal to 20 $\mu$m, the area of each surface electrode is set to fall within the range from 0.002 mm$^2$ to 0.2 mm$^2$, and each surface electrode is formed to project from the element surface.

Other objects of the present invention will become apparent from the following detailed description of the embodiments.

DETAILED DESCRIPTION OF THE PREFERRED EMBODIMENTS

Figure 1A:
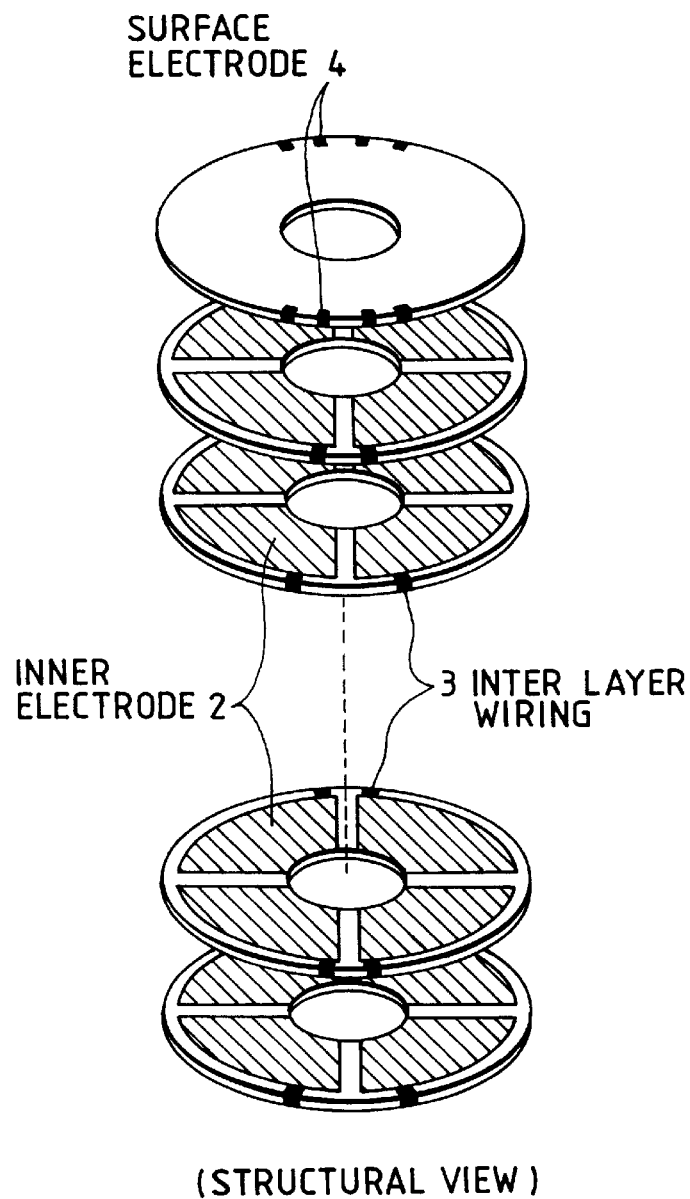
FIGS. 1A and 1B are respectively a structural view and an external view of a laminated ceramic piezoelectric element according to the present invention.

In the preferred embodiment, the smoothness of the upper and lower surfaces of the element is defined, so that each surface is formed to be a flat surface having a level difference or surface roughness which is less than or equal to 20 $\mu$m.

It was found based on the experimental results that when the level difference in each of the upper and lower surfaces of the element is larger than 20 $\mu$m, if the element is used in a Langevin type ultrasonic wave motor or actuator, the mechanical quality coefficient (Qm) lowers as a whole, and the difference ($\Delta F$) between the resonant frequencies in the respective phases becomes large.

A method of manufacturing a laminated ceramic piezoelectric element having flat upper and lower surfaces is roughly classified into the following two methods.

In one method, an element with a high flatness is manufactured by performing warp correction (re-sintering) or lapping after sintering. In this case, surface electrodes and the like can be formed thereafter.

In the other method, the element is manufactured while carefully controlling processes such as formation, sintering, and the like so as not to cause a deformation or warp.

The present invention may adopt either of the above-mentioned methods, and is not particularly limited to a specific manufacturing method.

In this embodiment, the height of each surface electrode is not taken into consideration. For this reason, when the element of the present invention is used, terminals must be formed to cancel the height of each surface electrode.

More specifically, for example, the following countermeasure must be taken. That is, the terminal portion of an electrode plate to be connected to the surface electrode must be recessed in correspondence with the height of the electrode.

Upon measurement of the level difference (excluding the surface electrode portions) in each of the upper and lower surfaces of the element, the difference is preferably measured three-dimensionally using a non-contact type shape measurement device while placing the element on a flat surface, since the value can then be accurately measured.

The difference may be measured by a contact type shape measurement device, e.g., a surface roughness meter. However, when the element has a convex rear surface, the element may be inadvertently actuated by, e.g., the probe pressure, and accurate measurement may then be disturbed.

In this embodiment, in addition to the above requirement, the area of each surface electrode is set to fall within the range from 0.002 mm$^2$ to 0.2 mm$^2$, and each surface electrode is formed to project from the element surface.

When the element has such surface electrodes, an element which allows connections with a surface electrode using electrode plates, and has a small resonant frequency difference ($\Delta F$) and a high mechanical quality coefficient (Qm) can be realized.

More specifically, it was experimentally found that when the area of each surface electrode is smaller than 0.002 mm$^2$, the resistance value of the connection portion increases, and the mechanical quality coefficient (Qm) lowers; when the area is larger than 0.2 mm$^2$, the influence of the electrode thickness or the projection amount of the electrode cannot be eliminated even using a flexible circuit board, and the difference ($\Delta F$) between the resonant frequencies of the phases increases.

Each surface electrode preferably projects from the element surface to assure a connection with an electrode plate.

As a method of forming the above-mentioned surface electrodes, a print method is easiest. However, the present invention is not limited to this formation method. For example, a CVD method, sputtering method, or the like may be used. Alternatively, a conductor layer may be formed on the entire surface of the element, and its peripheral portions may be removed by, e.g., etching to form surface electrodes.

When a numerical value that defines the area of each surface electrode is converted into the diameter of a circle, each surface electrode has a diameter of about 50 $\mu$m to 500 $\mu$m. Since the surface electrode need not have a circular shape, the area is used defining the surface electrode in this embodiment. The area of the surface electrode defined in this embodiment is the projected area when viewed from above, and does not include the height component of any projecting or protruding portion.

In this embodiment, the projection amount of each surface electrode is defined to fall within the range from 1 $\mu$m to 20 $\mu$m.

The laminated ceramic piezoelectric element that satisfies only the above-mentioned two requirements is sufficiently practical. In addition, it was experimentally found that when the projection amount of each surface electrode from the element surface falls within the above-mentioned range, an element with a smaller difference ($\Delta F$) between the resonant frequencies of the phases and a higher mechanical quality coefficient (Qm) can be realized, and an electrical connection can be reliably attained, thus providing an element with higher reliability.

The formation method of the surface electrodes with the above-mentioned projection amount is not particularly limited. In consideration of the projection amount (thickness) of the surface electrode to be formed, the print method is most suitable.

In a laminated ceramic piezoelectric element 11 shown in FIGS. 5A and 5B (to be described later), i.e., in the element in which electrodes 12 present inside the element are connected by an inter layer wiring line 13 formed inside the element, when the element 11 is subjected to surface lapping, the piezoelectric element material (normally consisting of PZT-based ceramic) is ground more than the inter layer wiring line 13 (normally consisting of Ag-Pd or Pt), and consequently, the inter layer wiring line 13 projects from the element surface. For this reason, by controlling the lapping condition, a surface electrode 14 having the above-mentioned projection amount can be formed.

In this embodiment, the positional relationship of the surface electrodes formed on the element is defined, so that the surface electrodes have a well-balanced layout in the surface of the element.

Even when the influence of the thickness or projection amount of each surface electrode can be eliminated using a flexible circuit board, since the surface electrodes themselves do not vibrate, they become noise components with respect to resonance. If such surface electrodes are formed to be concentrated on one portion of the element, the resonant frequency of the element portion where the surface electrodes are concentrated becomes different from that of other element portions, and hence, the mechanical quality coefficient (Qm) lowers.

Note that "the well-balanced layout of the surface electrodes in the surface of the element" includes not only a case wherein, for example, eight surface electrodes are arranged at equal angular intervals on a single circumference, but also a case wherein pairs of surface electrodes which are close to each other are arranged at four positions at equal angular intervals on a single circumference.

Figure 5A:
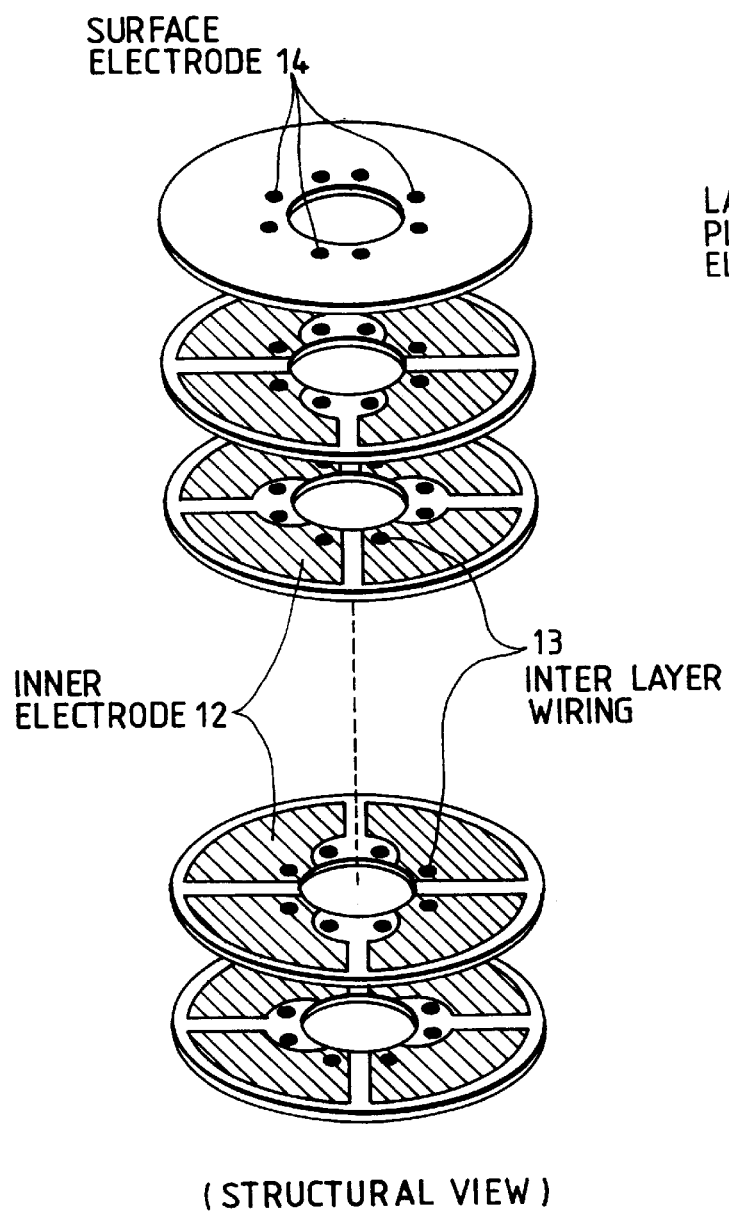
FIGS. 5A and 5B are respectively a structural view and an external view of a laminated ceramic piezoelectric element according to the present invention.
Figure 5B:
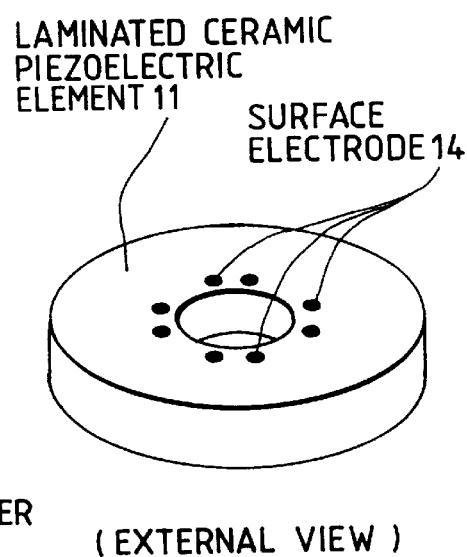

In this embodiment, as shown in FIG. 5A, inner electrodes 12 of the element 11 are connected by inter layer wiring lines 13 formed inside the element.

Figure 7A:
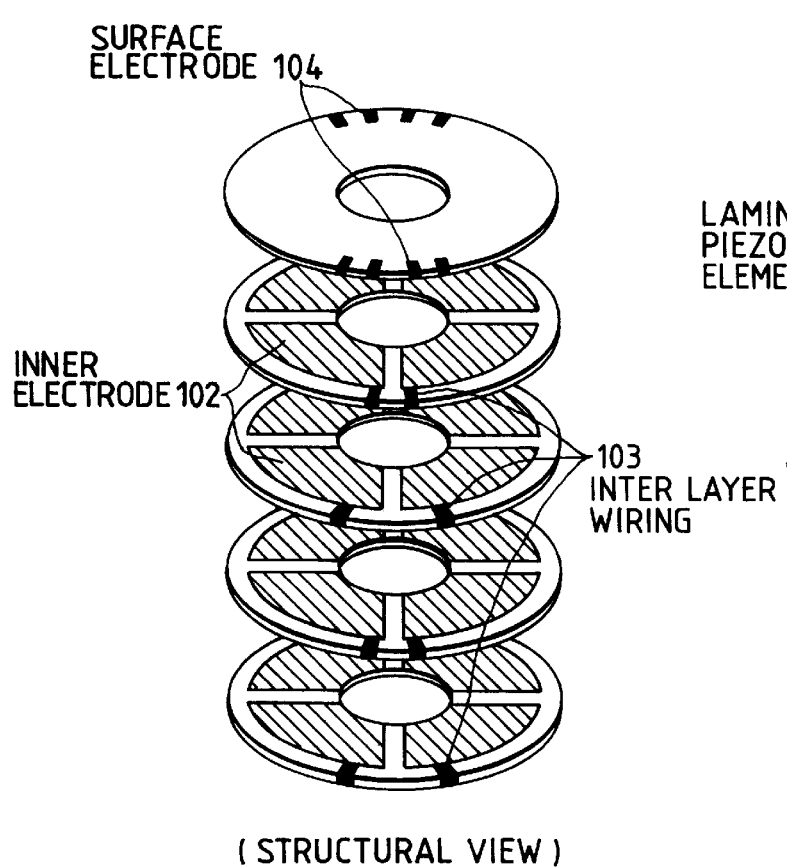
FIGS. 7A and 7B are respectively a structural view and an external view of a laminated ceramic piezoelectric element.
Figure 7B:
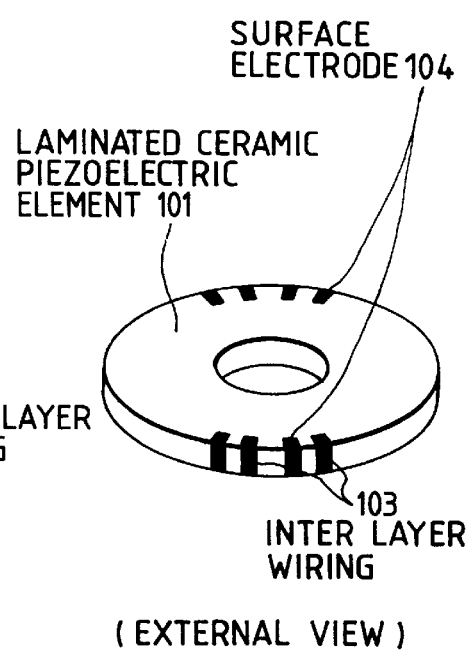

When the inter layer wiring lines 13 are formed inside the element, inter layer wiring lines (e.g., the inter layer wiring lines 103 shown in FIG. 7) that form extra projections on the outer wall surface of the element can be omitted, and noise with respect to resonance of the element can be removed. For this reason, the resonant frequency difference of the vibration member can be further reduced, and a higher mechanical quality coefficient (Qm) is obtained since the resonance curve becomes sharp.

The inter layer wiring lines 13 inside the element are so-called via holes or through holes, and can be formed using the manufacturing technique of a low-temperature sintering type ceramic substrate.

In a general method of forming via holes, holes are formed in a green sheet of a piezoelectric member before lamination, and are filled with a conductor paste. Then, inner electrode patterns are printed on the sheet, and thereafter, the sheets are laminated and sintered.

With this method, the inner electrodes and via hole electrodes are integrally sintered, and wiring lines connecting layers of the element can be formed.

Of course, the present invention is not limited to the above-mentioned method as long as inter layer wiring lines can be formed inside the element.

Figure 6:
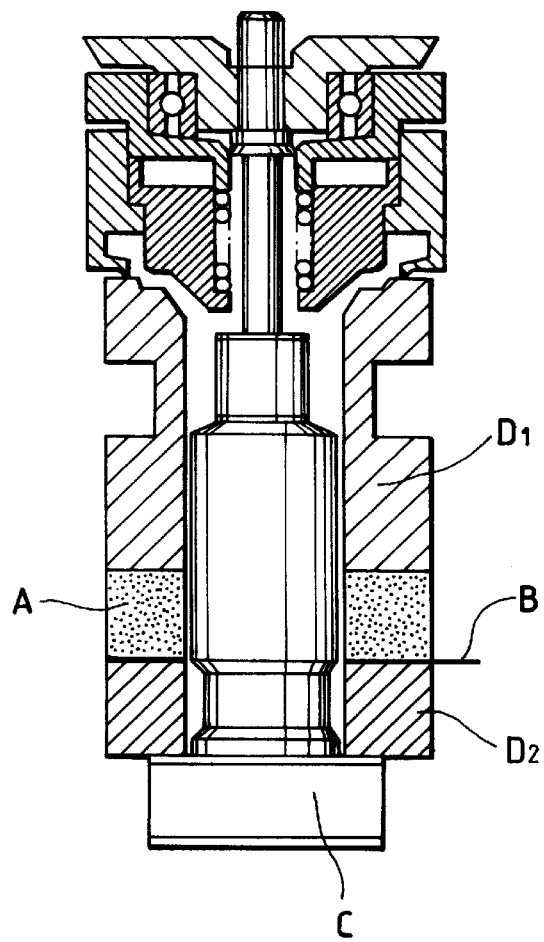
FIG. 6 is a sectional view of an ultrasonic wave motor which incorporates the laminated ceramic piezoelectric element according to the present invention.

Furthermore, in this embodiment, as shown in FIG. 6, a method of supplying electric power to an element A according to this embodiment is defined, so that a wiring board B is in press contact with the surface of the element A having surface electrodes.

A conductor layer is formed on the wiring board B. For example, when the element A according to this embodiment is used in a Langevin type ultrasonic wave motor, as shown in FIG. 6, the surface electrodes projecting from the surface of the element A bite into the conductor layer on the wiring board B by the fastening force of a bolt C and stators $D_1$ and $D_2$, thus attaining a reliable electrical connection. In addition, the surface electrodes and the conductor layer undergo a plastic deformation, thereby realizing a uniform contact state.

Note that the wiring board B preferably comprises a so-called flexible circuit board constituted by forming a conductor such as copper or solder on the surface of a board consisting of a polymer material with high elasticity or plasticity, or an insulating material with both high elasticity and plasticity.

The wiring board B having such a nature easily deforms due to the fastening force of the bolt C and the stators $D_1$ and $D_2$, and eliminates the influence of surface electrodes projecting from the surface of the element A to attain a uniform contact state with the element A.

Note that a wiring pattern consisting of a conductor is formed on almost the entire surface of the conductor layer on the wiring board B so as to independently attain power supply and electrical connection to the surface electrodes of the laminated ceramic piezoelectric element A.

Figure 8:
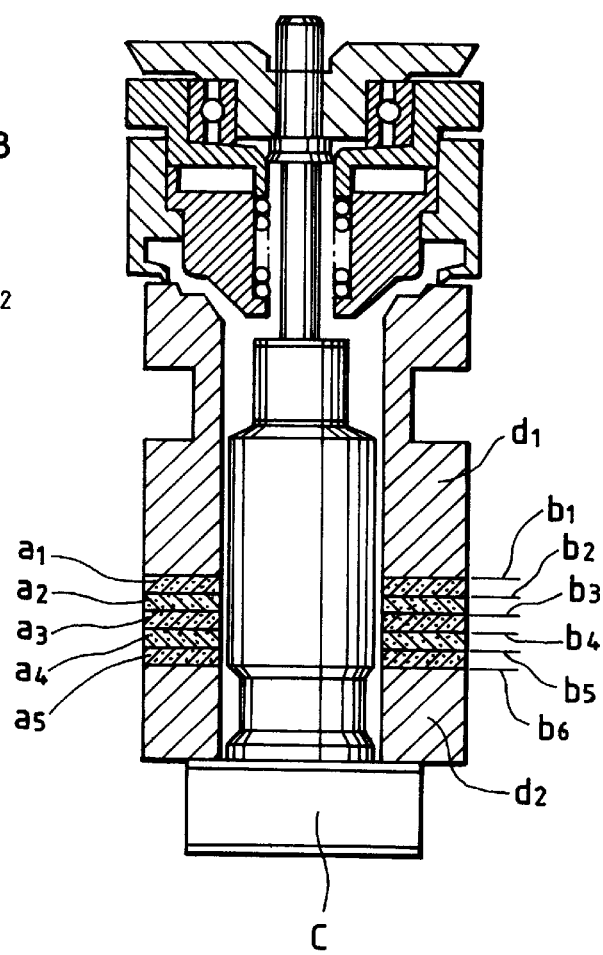
FIG. 8 is a sectional view of a conventional ultrasonic wave motor which incorporates a plurality of ceramic piezoelectric element plates.

In a conventional Langevin type ultrasonic wave motor using a plurality of laminated single-layered piezoelectric element plates, each of six metal plates $b_1$ to $b_6$ serving as electrodes is sandwiched between adjacent ones of five ceramic piezoelectric elements $a_1$ to $a_5$ to obtain a vibration member, as shown in, e.g., FIG. 8, and a driving signal is input to the vibration member via the metal plates $b_1$ to $b_6$. These six metal plates $b_1$ to $b_6$ absorb the level differences or unevenness of the upper and lower surfaces of the ceramic piezoelectric element plates $a_1$ to $a_5$, and the fastening force of a bolt c and stators $d_1$ and $d_2$ uniformly acts on the plate surfaces of the ceramic piezoelectric element plates $a_1$ to $a_5$. As a result, an ultrasonic wave motor having a small difference ($\Delta F$) between the resonant frequencies of the phases and a high mechanical quality coefficient (Qm) is realized.

Of course, due to the vibration absorption effect of the many metal plates $b_1$ to $b_6$ sandwiched between the adjacent ceramic piezoelectric element plates, the motor efficiency is not high.

However, in the case of the laminated ceramic piezoelectric element, since electrodes have already been formed inside the element, only one electrode plate for attaining an electrical connection with the surface electrodes of the element A is required, as shown in, e.g., FIG. 6, and high efficiency is theoretically obtained. However, in practice, when the element is fastened using the bolt and stators, the influence of level differences present on the upper and lower surfaces of the element, which is absorbed in the conventional single-layered piezoelectric element plate, appears considerably, and the fastening force of the bolt and stators becomes nonuniform in the plate surface of the element. As a result, this nonuniformity impairs motor efficiency, and increases the resonant frequency difference between the phases.

Under these circumstances, in the present invention, since at least the flatness of the upper and lower surfaces of the piezoelectric elements and the area of each surface electrode are defined in detail, when the laminated ceramic piezoelectric element is used in, e.g., a Langevin type ultrasonic wave motor or actuator, the fastening force of the bolt and stators can uniformly act on the plate surface of the element, and an ultrasonic wave motor or actuator having original characteristics of the piezoelectric element, and practically satisfactory performance can be provided.

Experimental examples that demonstrate the effect of the laminated ceramic piezoelectric element according to the present invention will be described below.

EXPERIMENT 1

Figure 1B:
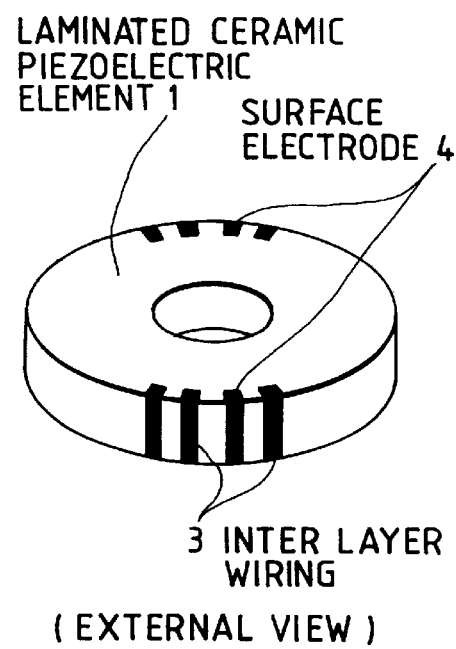

A PZT-based piezoelectric sheet was used, and inner electrodes 2 were formed by the print method, thus preparing a laminated ceramic piezoelectric element 1 with the structure shown in FIGS. 1A and 1B.

The element 1 had a thickness of about 100 $\mu$m per layer, and a total of 15 layers were laminated. The element had a diameter of 10 mm and an inner diameter of 5 mm. Inter layer wiring lines 3 were formed in such a manner that the side surfaces of every other one of the piezoelectric sheets were coated with an insulating material during the manufacture of the element, the sheets were connected using a conductor paste, and thereafter, the sheets were sintered. The upper and lower surfaces of the element were subjected to lapping after sintering to be formed into smooth surfaces having a level difference (to be referred to as a "flatness" hereinafter) of 1 to 20 $\mu$m in each surface. On the smooth upper surface of the element, 1-$\mu$m thick surface electrodes 4 connected to the inter layer wiring lines 3 on the side surface of the element were formed by the sputtering method. The number of electrodes was a total of eight, i.e., four+and–electrodes of the A and B phases and four ground electrodes. As shown in FIGS. 1A and 1B, each of the four surface electrodes were formed to be concentrated on the front and rear portions of the upper surface of the element.

When several laminated ceramic piezoelectric elements were polarized and assembled in Langevin type ultrasonic wave motors, as shown in FIG. 6, and their mechanical quality coefficient (Qm) was measured. As a result, the mechanical quality coefficient (Qm) was 500 to 700. On the other hand, the difference ($\Delta F$) between the resonant frequencies of the A and B phases was 70 to 100 Hz.

EXPERIMENT 2

Several laminated ceramic piezoelectric elements, which had substantially the same structure and condition as those of Experiment 1, except that they were manufactured without lapping of the upper and lower surfaces of the element after sintering in Experiment 1 and had a flatness as large as 24 to 40 $\mu$m, were assembled in Langevin type ultrasonic wave motors, and their mechanical quality coefficients (Qm) and differences ($\Delta F$) between the resonant frequencies of the A and B phases were measured. As a result, the value Qm was 200 to 250, and the value $\Delta F$ was 110 to 230 Hz.

Since the value Qm is equal to or larger than 500 and the value $\Delta F$ is equal to or smaller than 110 Hz in terms of motor performance, the results of Experiment 2 are not preferable.

EXPERIMENT 3

Figure 2:
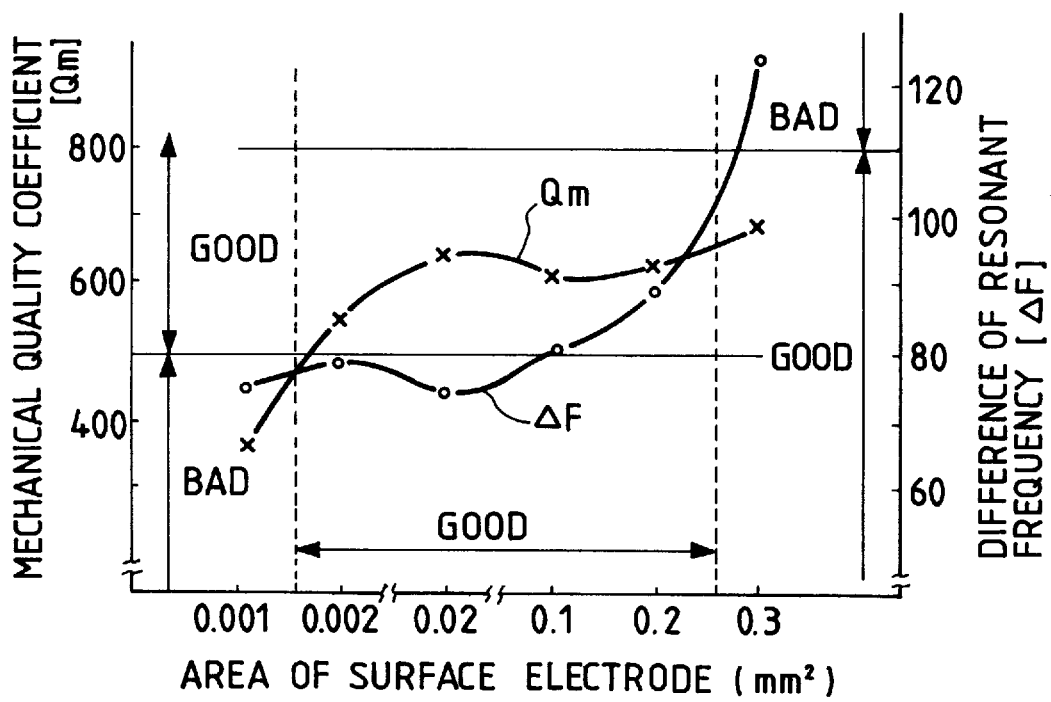
FIG. 2 is a graph showing the relationship among Qm, $\Delta F$, and the projection amount of the surface electrode in Experiment 3.

Elements (flatness=15 $\mu$m) were manufactured following the same procedures in Experiment 1 to have substantially the same structure and condition as those in Experiment 1 except that the surface electrodes were formed by the print method, so that the area of each surface electrode 4 had a value plotted along the abscissa in FIG. 2. Then, these elements were assembled in Langevin type ultrasonic wave motors, and their mechanical quality coefficients (Qm) and differences (ΔF) between the resonant frequencies of the A and B phases were measured.

FIG. 2 shows the relationship among the measured Qm and ΔF and the area of the surface electrode.

EXPERIMENT 4

Figure 3:
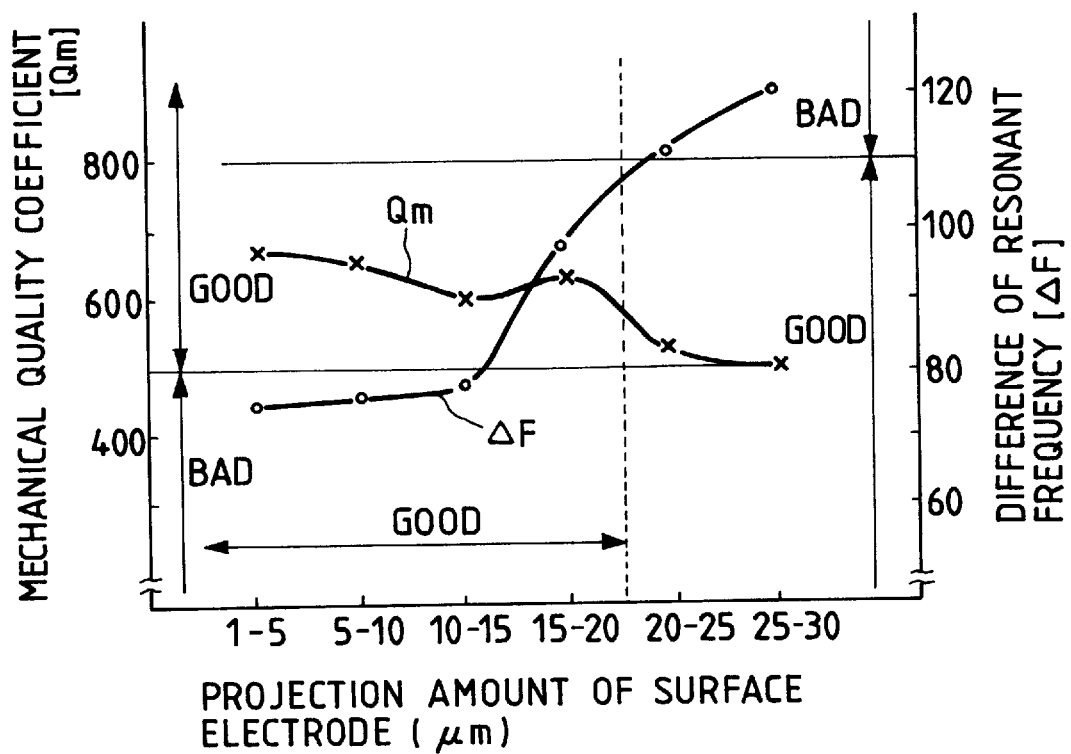
FIG. 3 is a graph showing the relationship among Qm, $\Delta F$, and the area of the surface electrode in Experiment 4.

Elements (flatness=15 μm) were manufactured following the same procedures in Experiment 1 to have substantially the same structure and condition as those in Experiment 1 except that the surface electrodes were formed by the print method, so that each surface electrode 4 had an area of 0.02 mm², and the projection amount of each electrode had a value plotted along the abscissa in FIG. 3. Then, these elements were assembled in Langevin type ultrasonic wave motors, and their mechanical quality coefficients (Qm) and differences (ΔF) between the resonant frequencies of the A and B phases were measured.

FIG. 3 shows the relationship among the measured Qm and ΔF and the projection amount of the surface electrode.

EXPERIMENT 5

Figure 4A:
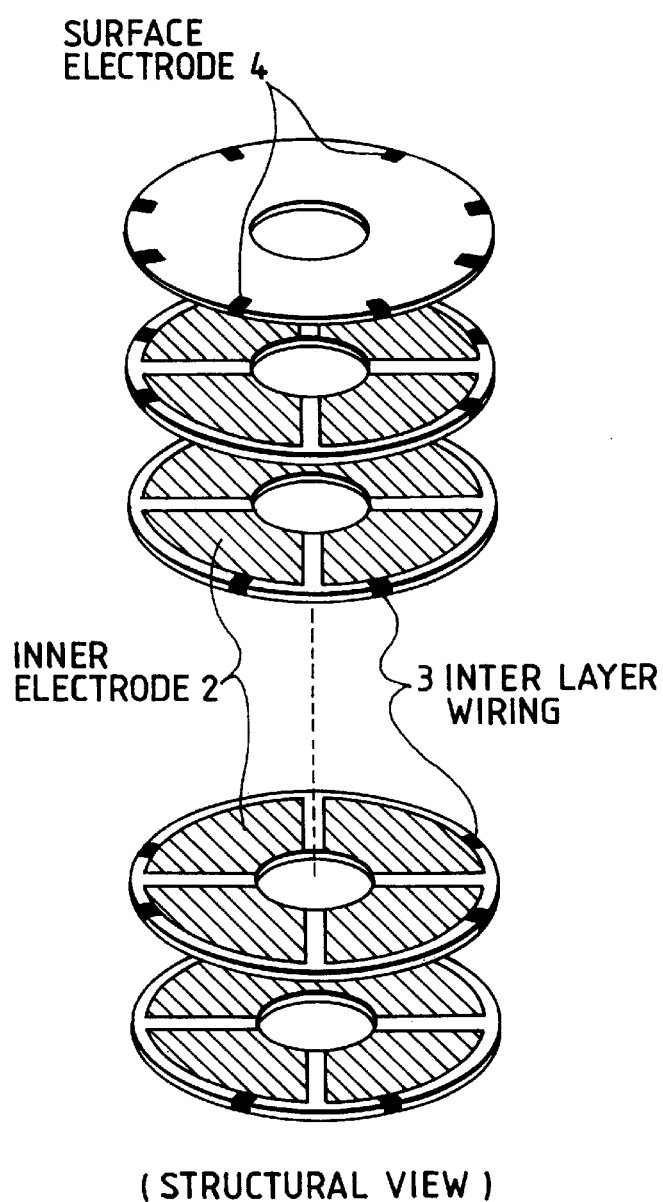
FIGS. 4A and 4B are respectively a structural view and an external view of a laminated ceramic piezoelectric element according to the present invention.
Figure 4B:
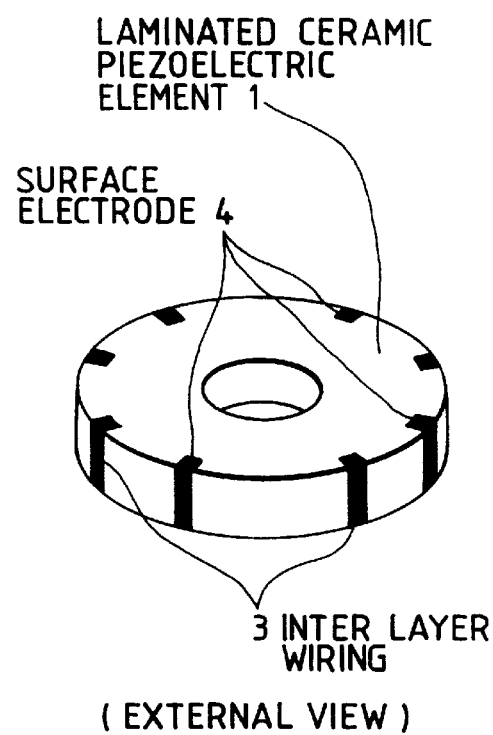

Elements (flatness=15 μm) were manufactured following the same procedures in Experiment 1 to have substantially the same structure and condition as those in Experiment 1 except that surface electrodes (area=0.02 mm² and projection amount=5 to 10 μm) 4 were formed at equal angular intervals on the upper surface of the element, as shown in FIGS. 4A and 4B. Then, these elements were assembled in Langevin type ultrasonic wave motors, and their mechanical quality coefficients (Qm) and differences (ΔF) between the resonant frequencies of the A and B phases were measured. The value Qm was 830, and the value ΔF was 57 Hz.

These results demonstrate that the formation positions of the surface electrodes effectively improve the values Qm and ΔF.

EXPERIMENT 6

Holes (via holes) having a diameter of 150 μm were formed using a punching machine on each of piezoelectric sheets consisting of the same material as those used in Experiment 1, and an Ag-Pd conductor paste was filled in these holes. Thereafter, inner electrode patterns were printed on the sheets, and the sheets were laminated and sintered, as shown in FIG. 5A, thus manufacturing an element having inner electrodes 12 and inter layer wiring lines 13.

The upper and lower surfaces of the element were lapped to have a flatness shown in Table 1 below, and surface electrodes 14 each having the area and projection amount shown in Table 1 below were formed by the print method to manufacture A type elements. On the other hand, via electrodes formed to project from the surface of the element by lapping were used as surface electrodes 14 each having the area and projection amount shown in Table 1 below to manufacture B type elements. These types of laminated ceramic piezoelectric elements 11 were polarized and assembled in Langevin type ultrasonic wave motors, and their mechanical quality coefficients (Qm) and differences (ΔF) between the resonant frequencies of the A and B phases were measured.

Table 1 below shows the measurement results.

TABLE 1

| | A type | | | | B type | | |
|---|---|---|---|---|---|---|---|
| Flatness of Element (μm) | 5 | 9 | 18 | 19 | 8 | 18 |
| Surface Electrode Area (mm²) | 0.02 | 0.02 | 0.2 | 0.2 | 0.02 | 0.02 |
| Surface Electrode Projection Amount (μm) | 5 to 10 | 15 to 20 | 5 to 10 | 15 to 20 | 1 to 5 | 15 to 20 |
| Mechanical Quality Coefficient | 770 | 660 | 640 | 570 | 830 | 760 |
| Resonant Frequency Difference (Hz) | 39 | 45 | 62 | 78 | 48 | 59 |

As can be seen from Table 1, when the element has an element flatness of 20 μm or less, a surface electrode area of 0.2 mm² or less, and a surface electrode projection amount of 20 μm or less, it can exhibit high performance as a vibration member.

The above-mentioned experimental examples demonstrate that the laminated ceramic piezoelectric element according to the present invention has a small resonant frequency difference (ΔF) between the phases and a high mechanical quality coefficient (Qm) when it is assembled in a Langevin type ultrasonic wave motor. Furthermore, the laminated ceramic piezoelectric element according to the present invention can be satisfactorily used as one for a ring-shaped ultrasonic wave motor.

As described above, according to the above-mentioned piezoelectric element, a vibration wave motor or actuator having original characteristics of the piezoelectric element and practically satisfactory performance can be provided.

What is claimed is:

1. A laminated piezoelectric element formed by laminating a plurality of piezoelectric sheets, sintering the laminated piezoelectric element, and lapping a surface of the laminated piezoelectric element, said laminated piezoelectric element comprising:

a plurality of surface electrodes formed on the surface of said laminated piezoelectric element, each surface electrode having an area falling within a range of from 0.002 mm² to 0.2 mm²; and a first region on the surface of said laminated piezoelectric element on which said plurality of surface electrodes are formed, excluding said plurality of surface electrodes, and having a level difference which is less than or equal to 20 μm, wherein said plurality of surface electrodes are projected from said first region.

2. A laminated piezoelectric element according to claim 1, wherein a projection amount of each of said surface electrodes is within a range of from 1 μm to 20 μm.

3. A laminated piezoelectric element according to claim 1, wherein said laminated piezoelectric element has a substantially cylindrical shape, said plurality of surface electrodes are formed on only one of upper and lower surfaces, in an axial direction, of said laminated piezoelectric element, and the other one of said upper and lower surfaces has a level difference which is less than or equal to 20 μm.

4. A laminated piezoelectric element according to claim 2, wherein said laminated piezoelectric element has a substantially cylindrical shape, and said plurality of surface electrodes are formed on only one of upper and lower surfaces, in an axial direction, of said laminated piezoelectric element.

5. A laminated piezoelectric element according to claim 1, wherein said plurality of surface electrodes are formed inside said laminated piezoelectric element, said plurality of surface electrodes being connected by an inter layer conductor formed inside said laminated piezoelectric element.

6. A laminated piezoelectric element according to claim 3, wherein said plurality of surface electrodes are formed inside said laminated piezoelectric element, said plurality of surface electrodes being connected by an inter layer conductor formed inside said laminated piezoelectric element.

7. A laminated piezoelectric element according to claim 1, wherein said laminated piezoelectric element is manufactured by sintering a plurality of laminated ceramic plates.

8. A laminated piezoelectric element according to claim 3, wherein said laminated piezoelectric element is manufactured by sintering a plurality of laminated ceramic plates.

9. A laminated piezoelectric element according to claim 5, wherein said laminated piezoelectric element is manufactured by sintering a plurality of laminated ceramic plates.

10. A laminated piezoelectric element according to claim 3, wherein said plurality of surface electrodes are identical, and are formed at peripheral edge positions of said laminated piezoelectric element.

11. A laminated piezoelectric element according to claim 3, wherein said laminated piezoelectric element is formed with a central hole, and said plurality of surface electrodes are identical and are formed in the vicinity of a peripheral edge of said central hole.

12. A vibration actuator using a laminated piezoelectric element formed by laminating a plurality of piezoelectric sheets, sintering the laminated piezoelectric element, and lapping a surface of said laminated piezoelectric element, said vibration actuator comprising:

a vibration member which functionally contacts said laminated piezoelectric element, wherein a plurality of surface electrodes each having an area falling within a range of 0.002 mm$^2$ to 0.2 mm$^2$ are formed on the surface of said laminated piezoelectric element, wherein a level difference of a first region of said surface, excluding said plurality of surface electrodes on said surface and on which said plurality of surface electrodes are set, is less than or equal to 20 $\mu$m, and wherein said plurality of surface electrodes are projected from said first region.

13. A vibration actuator according to claim 12, further comprising:

a circuit board which is in press contact with the surface on which said plurality of surface electrodes are formed, electric power being supplied to said laminated piezoelectric element via said circuit board.

14. A vibration actuator according to claim 13, wherein said circuit board comprises a flexible circuit board.

15. A vibration actuator according to claim 12, further comprising:

a contact member contacted by said vibration member and driven thereby, said vibration member and said contact member being moved relative to each other.

16. A vibration actuator according to claim 12, wherein a projection amount of each of said plurality of surface electrodes is within a range of from 1 $\mu$m to 20 $\mu$m.

17. A vibration actuator according to claim 16, wherein said laminated piezoelectric element has a substantially cylindrical shape, said plurality of surface electrodes are formed on only one of upper and lower surfaces, in an axial direction, of said laminated piezoelectric element, and the other one of said upper and lower surfaces has a level difference which is less than or equal to 20 $\mu$m.

18. A vibration actuator according to claim 12, wherein said plurality of surface electrodes are formed inside said laminated piezoelectric element, and said plurality of surface electrodes are connected by an inter layer conductor formed inside said laminated piezoelectric element.

19. A vibration actuator according to claim 12, wherein said laminated piezoelectric element is manufactured by sintering a plurality of laminated ceramic plates.

* * * * *

UNITED STATES PATENT AND TRADEMARK OFFICE
CERTIFICATE OF CORRECTION

PATENT NO. : 5,770,916

DATED : June 23, 1998

INVENTOR(S): TORU EZAKI, ET AL.

It is certified that error appears in the above-identified patent and that said Letters Patent is hereby corrected as shown below:

ON THE COVER PAGE:

Item [73] Assignees

"Canon Kabushiki Kaisha; Nihon Cement Co., Ltd." should read --Canon Kabushiki Kaisha; Nihon Cement Co., Ltd., both of Tokyo, Japan--.

COLUMN 1:

Line 58, "a" should be deleted.

COLUMN 6:

Line 40, "When several" should read --Several--.

COLUMN 9:

Line 6, "inter layer" should read --interlayer--.
Line 11, "inter layer" should read --interlayer--.

UNITED STATES PATENT AND TRADEMARK OFFICE
CERTIFICATE OF CORRECTION

PATENT NO. : 5,770,916

DATED : June 23, 1998

INVENTOR(S) : TORU EZAKI, ET AL.

It is certified that error appears in the above-identified patent and that said Letters Patent is hereby corrected as shown below:

<u>COLUMN 10</u>:

Line 35, "inter layer" should read --interlayer--.

Signed and Sealed this

Second Day of March, 1999

Attest:

Q. TODD DICKINSON

*Attesting Officer*  *Acting Commissioner of Patents and Trademarks*